(12) United States Patent
Manabe et al.

(10) Patent No.: US 6,380,058 B2
(45) Date of Patent: *Apr. 30, 2002

(54) METHOD AND APPARATUS FOR MANUFACTURING SEMICONDUCTOR DEVICE

(75) Inventors: Seiji Manabe, Itami; Mitsuo Kimoto, Tokyo, both of (JP)

(73) Assignees: Mitsubishi Denki Kabushiki Kaisha, Tokyo; Ryoden Semiconductor System Engineering Corporation, Hyogo, both of (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,942

(22) Filed: Mar. 8, 1999

(30) Foreign Application Priority Data

Aug. 7, 1998 (JP) .......................... 10-224141

(51) Int. Cl.$^7$ .............................. H01L 21/44

(52) U.S. Cl. ................ 438/597; 438/788; 438/775; 204/192.1

(58) Field of Search ............... 438/788, 785, 438/778, 775, 597; 204/192.1, 192.11, 298.01, 298.04

(56) References Cited

U.S. PATENT DOCUMENTS

| | | | |
|---|---|---|---|
| 5,455,197 A | | 10/1995 | Ghanbari et al. |
| 5,540,820 A | * | 7/1996 | Terakado et al. ........ 204/192.3 |
| 5,780,357 A | * | 7/1998 | Xu et al. .................... 438/639 |
| 5,919,345 A | * | 7/1999 | Tepman .................. 204/298.2 |

FOREIGN PATENT DOCUMENTS

| | | |
|---|---|---|
| JP | 55-162244 A | 12/1980 |
| JP | 59-182207 A | 10/1984 |
| JP | 63-149376 A | 6/1988 |
| JP | 5-36685 A | 2/1993 |
| JP | 6-158299 A | 6/1994 |
| JP | 07252655 A | 10/1995 |
| JP | 08022955 A | 1/1996 |
| JP | 08-127870 | 5/1996 |
| JP | 10079358 A | 3/1998 |
| JP | 10083585 A | 3/1998 |
| KR | 93-1855 | 3/1993 |

OTHER PUBLICATIONS

German Office Action dated Nov. 21, 2000 with English translation.

* cited by examiner

Primary Examiner—Matthew Smith
Assistant Examiner—Renzo N. Rocchegiani
(74) Attorney, Agent, or Firm—McDermott, Will & Emery

(57) ABSTRACT

A barrier layer is formed at a bottom portion, for example, of a through hole. The thickness of the barrier layer at an upper area, for example, of the through hole is made uniform. The method of manufacturing a semiconductor device includes the steps of: forming a barrier layer by sputtering on a main surface of a silicon substrate while maintaining a first distance between a main surface of the target and the main surface of the silicon substrate; and forming a titanium nitride layer by sputtering on and adjacent to a titanium nitride layer by scattering a target material while maintaining a second distance longer than the first distance between the main surface of the target and the main surface of the silicon substrate.

6 Claims, 5 Drawing Sheets

METHOD AND APPARATUS FOR MANUFACTURING SEMICONDUCTOR DEVICE

BACKGROUND OF THE INVENTION

1. Field of the Invention

The present invention relates to a method and an apparatus for manufacturing a semiconductor device. More particularly, the present invention relates to a method and an apparatus for manufacturing a semiconductor device having a barrier layer.

2. Description of the Background Art

Conventionally, a semiconductor device is formed by stacking a plurality of layers each having an interconnection layer. For connecting interconnection layers included in the adjacent layers, first a through hole is formed and then a plug of tungsten or the like is filled in to the through hole. For preventing tungsten diffusion and oxidation, a barrier layer of titanium, titanium nitride or the like is generally formed on bottom and side surfaces of the through hole by sputtering.

In recent years, diameter of the through hole is gradually decreasing along with the miniaturization of the semiconductor device. The depth of the through hole, however, does not become smaller because the thickness of the layers constituting the semiconductor device does not significantly change in spite of the miniaturization of the device. Thus the aspect ratio (a ratio of the depth to the diameter) of the through hole tends to increase.

In a conventional sputtering technique, when the diameter of the through hole is small, a barrier layer is formed only at an upper portion and not on the bottom surface of the through hole. When tungsten is filled in such through hole, aluminum alloy in a lower layer changes its quality at the bottom portion of the through hole, whereby a poor connection or disconnection tends to occur in this area.

Japanese Patent Laying-Open No. 8-127870 addresses this problem by placing a target including a material of a barrier layer a distance as long as 200 mm, away from a silicon substrate on which the barrier layer is to be formed at the sputtering and forming the barrier layer on the bottom surface of the through hole as well.

The method of manufacturing the barrier layer according to the above mentioned layed-open application has the following problems. FIG. 7 is a schematic diagram of a sputtering apparatus referenced for describing the problem of the conventional method. As shown in FIG. 7, in the sputtering apparatus, a silicon substrate 100 and a target 120 of titanium which is a material of the barrier layer are disposed opposite to each other. An interlayer insulation film 101 is formed on silicon substrate 100. A through hole 102 is formed in a central area of interlayer insulation film 101. Additionally a through hole 103 is formed in an outer peripheral area of interlayer insulation film 101. The distance between target 120 and a surface of silicon substrate 100 is about 200 mm.

In the sputtering apparatus with such a configuration, an angle at which the target is viewed from a lower edge of a side surface 102c or 102d of through hole 102 through the opening of through hole 102 is defined as β°.

In the outer peripheral area of interlayer insulation film 101, an angle at which target 120 is viewed from a lower edge of a side surface 103d on the outer peripheral side of through hole 103 is β°. An angle at which target 120 is viewed from a lower edge of a side surface 103c on a central side of interlayer insulation film 101 through an opening of through hole 103 is defined as α°. Here, α° is smaller than β°.

FIG. 8 is a sectional view of a barrier layer manufactured by the apparatus shown in FIG. 7. Referring to FIG. 8, as the angle at which target 120 is viewed from the lower edge of side surface 103c is α° which is relatively small as shown in FIG. 7, the number of titanium atoms colliding with side surface 103c becomes small, whereby a barrier layer 104 becomes thinner at side surface 103c and an upper portion 103a of through hole 103. Conversely, as the angle at which target 120 is viewed from the lower edge of side surface 103d is β° which is relatively large, the number of titanium atoms colliding with side surface 103d becomes large, whereby barrier layer 104 becomes thicker at side surface 103d and at an upper portion 103b farther from the center of silicon substrate 100. The center of silicon substrate 100 is located in the direction shown by an arrow 110.

When barrier layer 104 is thin at some portions, $WF_6$ gas used for manufacturing a tungsten plug may react with the thin portion of barrier layer 104 in upper portion 103a of the through hole, thereby causing the barrier layer to be peeled off.

SUMMARY OF THE INVENTION

An object of the present invention is to provide a method and an apparatus for manufacturing a semiconductor device allowing a barrier layer formation in a lower portion of a semiconductor substrate, such as a bottom portion of a through hole, with the thickness of the barrier being made uniform in an upper portion of the semiconductor substrate, such as an upper portion of the through hole, when the through hole or a recess portion with a large aspect ratio exists.

In accordance with one aspect of the present invention, in a method of manufacturing a semiconductor device, a main surface of a semiconductor substrate and a main surface of a target which is a material of a film to be formed on the main surface of the semiconductor substrate are disposed approximately parallel and opposite to each other, and the film is formed on the semiconductor substrate by sputtering the target material. The method includes the following steps.

(A) Forming a first film by sputtering on the main surface of the semiconductor substrate while maintaining a first distance between the main surface of the target and the main surface of the semiconductor substrate.

(B) Forming a second film by sputtering on and adjacent to the first film while maintaining a second distance shorter than the first distance between the main surface of the target and the main surface of the semiconductor substrate.

According to the method of manufacturing the semiconductor device including such steps, first, in the step (A), as the distance between the target and the semiconductor substrate is the first distance which is relatively long, when atoms of the target are scattered out of the target, the atoms are gravitated until they reach the semiconductor substrate. Therefore velocity component in a vertical direction gradually increases until the atoms reach the semiconductor substrate. As a result, the atoms of the target travel in a direction perpendicular to the extension of main surface of the substrate. Thus, a first layer can be formed as a barrier layer at the bottom surface of the through hole in an interlayer insulation film on the semiconductor substrate, even when the through hole has a large aspect ratio.

In the above step (B), as the distance between the target and the semiconductor substrate is the second distance which is relatively short, atoms of target tend to be scattered and directly reach the substrate in random directions. Therefore the thickness of a second layer as a barrier layer can be made uniform in the upper portion for example, of the through hole.

Preferably the first distance is at least 170 mm and the second distance is at most 80 mm. By setting the first distance at this value, the distance between the semiconductor substrate and the target is made long enough to ensure a vertical velocity component of atoms scattered from the target to become large. Therefore, the barrier layer can surely be formed in the bottom surface, for example, of the through hole. On the other hand by setting the second distance at this value, the distance between the semiconductor substrate and the target becomes short enough to allow random movement of atoms scattered from the target, whereby thickness of the barrier layer can be made uniform in the upper portion of the through hole.

On the semiconductor substrate, an interlayer insulation film having a hole is formed. Preferably, first and second films are formed so as to cover the bottom side surfaces of the hole. Here, the bottom surface and side surfaces of the hole can be surely covered by first and second layers as barrier layers.

In a method of manufacturing a semiconductor device in accordance with another aspect of the present invention, the main surface of the semiconductor substrate and the main surface of the target which is a material of a film to be formed on the main surface of the semiconductor substrate are disposed approximately parallel and opposite to each other, and the film is formed on the semiconductor substrate by sputtering the target material. The method includes the following steps.

(A) Forming a first film by sputtering on the main surface of the semiconductor substrate while maintaining an atmosphere between the main surface of the target and the main surface of the semiconductor substrate at a first pressure.

(B) Forming a second film by sputtering on the first film while maintaining an atmosphere between the main surface of the target and the main surface of the semiconductor substrate at a second pressure higher than the first pressure.

According to the method of manufacturing the semiconductor device having such steps, in the above step (A), the pressure between the target and the semiconductor substrate is at the first pressure, which is relatively low. Therefore, the atoms scattered from the target seldom collide with other atoms and the vertical velocity component of the atoms increases due to the gravity until they reach the semiconductor substrate. As a result, atoms are vertically directed to the semiconductor substrate. Thus a first layer as a barrier layer is formed on the bottom surface of the through hole mentioned above as well.

In the above step (B), as the atmosphere between the target and the semiconductor substrate is at the second pressure, which is relatively high, the atoms scattered from the target are likely to collide with other atoms. Then atoms scattered in random directions from the target still move in random directions when they reach the semiconductor substrate. Thus the thickness of a second layer as a barrier layer is made uniform at the upper portion of the through hole as well.

Preferably, the first pressure is at most 0.5 mTorr and the second pressure is at least 2 mTorr. In this case, by setting the first pressure as mentioned above, the fast pressure becomes low enough to increase the vertical velocity component of atoms scattered from the target, whereby a barrier layer can be surely formed at the bottom portion of the through hole. In addition, by setting the second pressure as mentioned above, the second pressure becomes high enough to allow movement of the atoms scattered from the target in random directions, whereby the thickness of the film at upper portion, for example, of the through hole is made uniform.

On the semiconductor substrate, an interlayer insulation film having a hole is formed. Preferably, first and second films are formed so as to cover the bottom and side surfaces of the hole. Here, the bottom surface and side surfaces of the hole can be surely covered by first and second layers as barrier layers.

In an apparatus for manufacturing the semiconductor device according to the present invention, the main surface of the semiconductor substrate and the main surface of the target which is a material of a film to be formed on the main surface of the semiconductor substrate are disposed approximately parallel and opposite to each other, and the film is formed on the semiconductor substrate by sputtering the target material, the apparatus includes a retainer, a substrate holding unit, a target holding unit, and a distance adjustment unit.

Pressure inside the retainer is reduced. The substrate holding unit provided in the retainer holds the semiconductor substrate. The target holding unit, provided in the retainer, holds the target such that the main surface of the target is approximately parallel and opposite to the main surface of the semiconductor substrate. The distance adjustment unit can adjust the distance between the main surface of the semiconductor substrate and the main surface of the target to one of the first distance for forming a first film on the main surface of the semiconductor substrate and the second distance shorter than the first distance for forming a second film on and adjacent to the first film by moving at least one of the target holding unit and the substrate holding unit.

In thus configured apparatus for manufacturing the semiconductor device, by sputtering while maintaining the relatively long first distance between the target and the semiconductor substrate, the vertical velocity component of the atoms scattered from the target increases until they reach the semiconductor substrate. Thus the number of atoms vertically directed to the semiconductor substrate becomes large. Therefore, a first film as a barrier layer can be formed at the bottom portion, for example, of the through hole. If sputtering is performed while the distance adjustment unit maintains the target and the semiconductor substrate at the relatively short second distance away from each other, atoms scattered from the target in random directions move randomly at the relatively upper portion of the semiconductor substrate. Therefore the thickness of the second layer as a barrier layer can be made uniform at the upper portion, for example, of the through hole.

Preferably, the first distance is at least 170 mm and the second distance is at most 80 mm. In this case, by setting the first distance as mentioned above, the distance between the semiconductor substrate and the target becomes long enough to increase the vertical velocity component of atoms scattered from the target, whereby the barrier layer is surely formed at the bottom portion, for example, of the through hole. In addition, by setting the second distance as mentioned above, the distance between the semiconductor substrate and the target becomes short enough to allow the movement of atoms scattered from the target in random directions, whereby the thickness of barrier layer can be made uniform at the bottom portion, for example, of the through hole.

An apparatus for manufacturing the semiconductor device according to another aspect of the present invention includes first and second sputtering apparatus and a transferring apparatus. The first sputtering apparatus disposes the main surface of the semiconductor substrate and the main surface of the target which is a material of a film to be formed on the main surface of the semiconductor substrate approximately parallel and opposite to each other while maintaining the first distance therebetween, and forms a first film on the semiconductor substrate by sputtering the target material. The second sputtering apparatus disposes the main surface of the semiconductor substrate and the main surface of the target which is a material of a film to be formed on the main surface of the semiconductor substrate approximately parallel and opposite to each other while maintaining the second distance shorter than the first distance therebetween, and forms the second film on and adjacent to the first film by sputtering the target material. The transferring apparatus transfers the semiconductor substrate with the first film from the first sputtering apparatus to the second sputtering apparatus.

In the apparatus for manufacturing the semiconductor device with such a configuration, as the sputtering is performed by the first sputtering apparatus while maintaining the relatively long first distance between the semiconductor substrate and the target, a vertical velocity component of atoms scattered from the target becomes large when they reach the semiconductor substrate due to the gravity. Thus the number of the atoms vertically directed to the semiconductor substrate becomes large and a first layer as a barrier layer can surely be formed at the bottom portion of the through hole.

In addition, as the second sputtering apparatus performs sputtering while maintaining the distance between the target and the semiconductor substrate at the relatively short second distance, atoms scattered in random directions from the target move in random directions at the surface of the semiconductor substrate as well. Therefore, the thickness of a second layer as a barrier layer can be made uniform at the upper portion of the semiconductor substrate. In addition, as the transferring apparatus transfers the semiconductor substrate from the first sputtering apparatus to the second sputtering apparatus, production efficiency of the semiconductor device can be improved.

Preferably, the first distance is at least 170 mm and the second distance is at most 80 mm. In this case, by setting the first distance as mentioned above, the distance between the semiconductor substrate and the target becomes long enough to increase the vertical velocity component of atoms scattered from the target, whereby the barrier layer is surely formed at the bottom portion, for example, of the through hole. In addition, by setting the second distance as mentioned above, the distance between the semiconductor substrate and the target becomes short enough to allow the movement of atoms scattered from the target in random directions, whereby the thickness of barrier layer can be made uniform at the bottom portion, for example, of the through hole.

In an apparatus for manufacturing the semiconductor device in accordance with still another aspect of the present invention, the main surface of the semiconductor substrate and the main surface of the target which is a material of a film to be formed on the main surface of the semiconductor substrate are disposed approximately parallel and opposite to each other, and the film is formed on the semiconductor substrate by sputtering the target material, the apparatus includes a retainer, a substrate holding unit, a target holding unit, and a pressure controlling unit.

Pressure inside the retainer is reduced. The substrate holding unit provided in the retainer holds the semiconductor substrate. The target holding unit, provided in the retainer, holds the target such that the main surface of the target is approximately parallel and opposite to the main surface of the semiconductor substrate. The pressure controlling unit can control the pressure in the retainer such that the pressure is maintained at one of the first pressure for forming a first film on the main surface of the semiconductor substrate and the second pressure higher than the first pressure for forming a second film on and adjacent to the first film.

In the apparatus for manufacturing the semiconductor device thus configured, when sputtering is performed while maintaining a relatively low pressure inside the retainer, atoms scattered from the target seldom collide with other atoms. Therefore the vertical velocity component of atoms reaching the semiconductor substrate is increased. Thus the atoms are vertically directed to the semiconductor substrate and a first layer as a barrier layer can be formed at the bottom portion, for example, of the through hole. In addition, when sputtering is performed while maintaining a relatively high second pressure inside the retainer, atoms scattered from the target are likely to collide with other atoms. Therefore the atoms reaching the semiconductor substrate move in random directions. Thus a second layer as a barrier layer has a uniform thickness at the upper area such as the upper portion of the through hole.

Preferably, the first pressure is at most 0.5 mTorr and the second pressure is at least 2 mTorr. By setting the first pressure low enough, as mentioned above, the vertical velocity component of atoms scattered from the target is increased, whereby a first layer as a barrier layer can surely be formed at the bottom surface, for example, of the through hole. On the other hand by setting the second pressure high enough, as mentioned above, atoms scattered from the target move in random directions, whereby the thickness of the second layer as a barrier layer can be made uniform at the upper portion of the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, the preferred embodiments of the present invention will be described with reference to the drawings.

First Example

Figure 1:
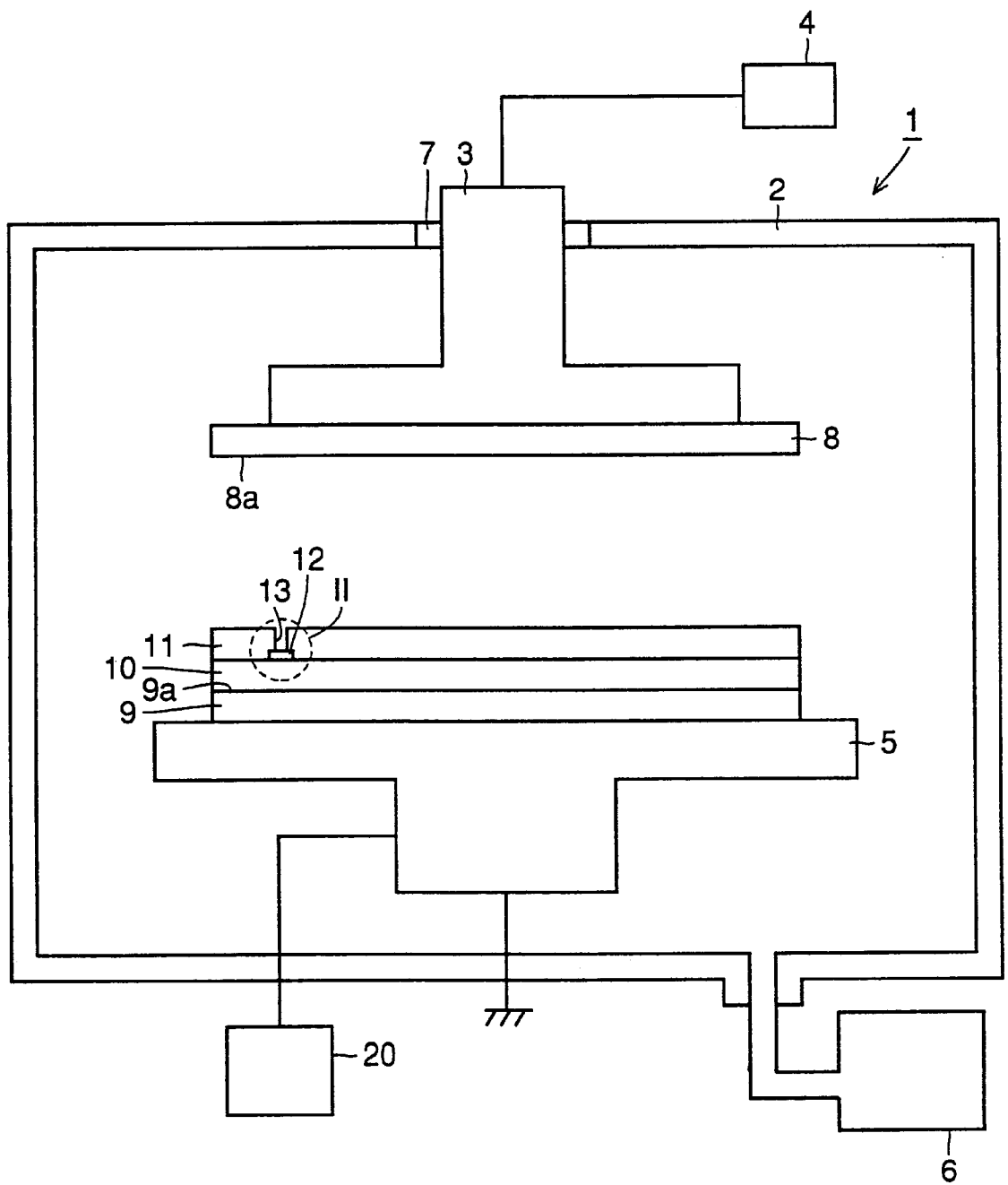
FIG. 1 is a schematic diagram of an apparatus for manufacturing a semiconductor device according to a first example of the present invention.

Referring to FIG. 1, a sputtering apparatus 1 as an apparatus for manufacturing a semiconductor device includes a container 2 as a retainer, an electrode 3 as target holding means, a high voltage power supply 4, a substrate supporting platform 5 as substrate holding means, a vacuum pump 6 as pressure controlling means, an insulator 7, a target 8 and a supporting platform transfer mechanism 20 as distance adjustment means.

Substrate supporting platform 5 is provided in container 2. A silicon substrate 9 is supported on substrate supporting platform 5. The potential of substrate supporting platform 5 is ground potential and supporting platform transfer mechanism 20 can appropriately adjust the distance from substrate supporting platform 5 to electrode 3 by moving the platform up and down as shown in FIG. 1. Electrode 3 is located at the upper portion of retainer 2 and holds target 8 of titanium. A main surface 8a of target 8 is supported opposite to and parallel with a main surface 9a of silicon substrate 9. Electrode 3 is electrically connected with high voltage power supply 4. Electrode 3 is electrically isolated from container 2 by insulator 7.

Container 2 is connected to vacuum pump 6 for adjusting (reducing) the pressure in container 2.

Figure 2:
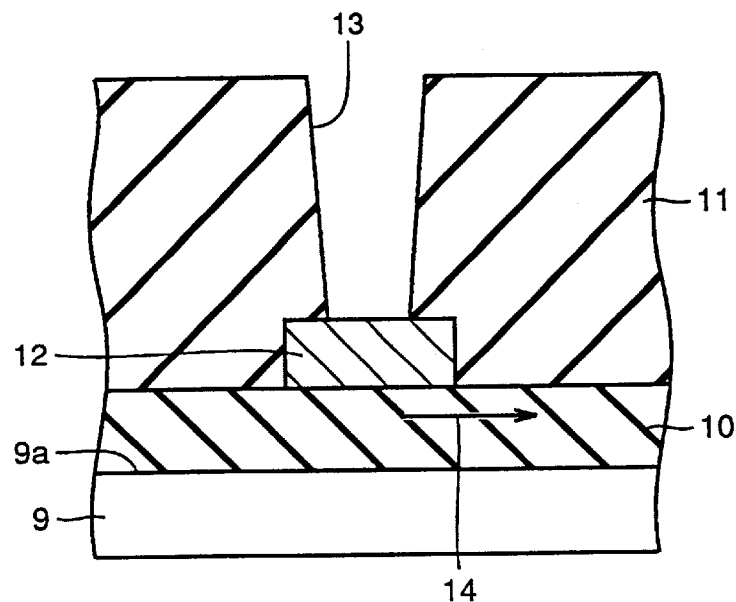
FIGS. 2–5 are sectional views showing first to fourth steps of a method of manufacturing a semiconductor device according to the present invention.

The following is the description of the method of manufacturing the semiconductor device using the sputtering apparatus. With reference to FIGS. 1 and 2, silicon substrate 9 is positioned on substrate supporting platform 5 of sputtering apparatus 1. On silicon substrate 9 are formed interlayer insulation films 10 and 11. An interconnection 12 is formed from aluminum alloy on interlayer insulation film 10. In interlayer insulation film 11 is formed a through hole 13 reaching interconnection 12.

Figure 3:
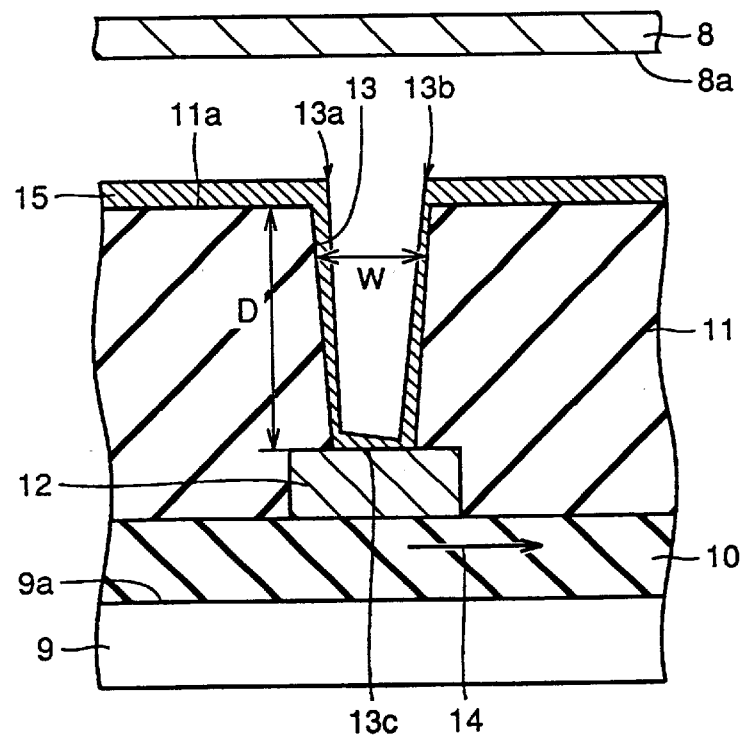

With reference to FIG. 3, the distance between main surface 9a of silicon substrate 9 and main surface 8a of target 8 is set at 170 mm. Then, container 2 is filled with argon and the pressure inside container 2 is reduced to 0.5 mTorr by vacuum pump 6. Next, after argon is turned into plasma, the argon plasma is caused to collide with target 8. Then the titanium atoms are scattered from target 8, forming a barrier layer (not shown) of titanium so as to cover the surface of interlayer insulation film 11 and the side surfaces and the bottom surface of through hole 13. The center of silicon substrate 9 is located in the direction shown by an arrow 14.

By introducing nitrogen gas into container 2, flow rate of nitrogen gas and flow rate of argon gas are made 30–40 ml/m and 7–10 ml/m, respectively. In this state, argon plasma is collided with target 8 and titanium atoms are scattered from target 8. As the distance between silicon substrate 9 and target 8 is as long as 170 mm, the vertical velocity component of the scattered titanium atoms is increased until they reach interlayer insulation film 11 on silicon substrate 9. Therefore titanium is deposited on the upper portions 13a and 13b and bottom surface 13c of through hole 13. Here, titanium reacts with nitrogen gas and forms a titanium nitride layer 15 as a first film (barrier layer).

Figure 4:
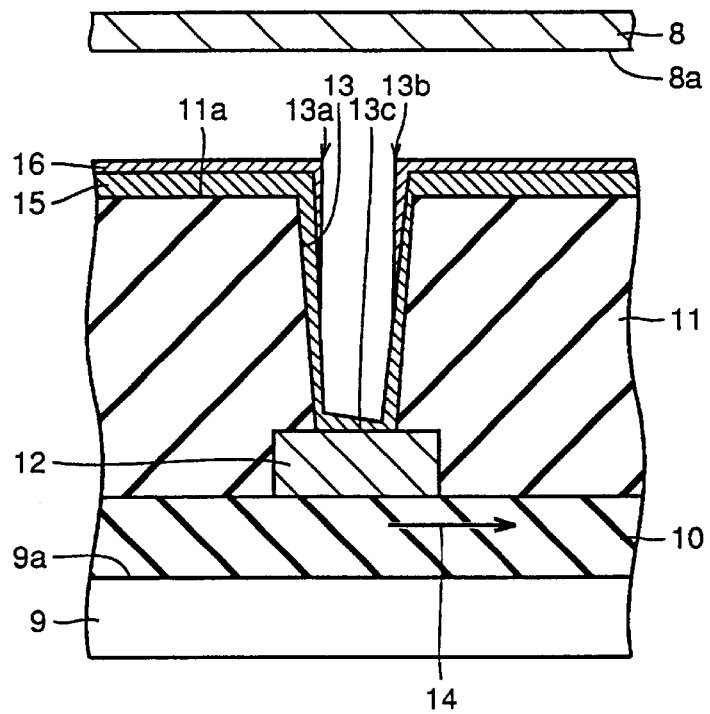

Referring to FIG. 4, the distance between silicon substrate 9 and target 8 is set by supporting platform transfer mechanism 20 at 50 mm. Flow rates of nitrogen gas and argon gas and the pressure in container 2 are the same with those in the step shown in FIG. 3. Then argon plasma collides with target 8, thereby causing titanium atoms to be scattered from target 8 in various directions. Because of the variation of direction of movement of titanium atoms, the atoms are unlikely to reach bottom surface 13c of through hole 13a. Titanium atoms are deposited to a uniform thickness near upper portions 13a and 13b of through hole 13. When being deposited on a titanium nitride layer 15, titanium atoms react with nitrogen gas and produce titanium nitride thereby forming a titanium nitride layer 16.

Figure 5:
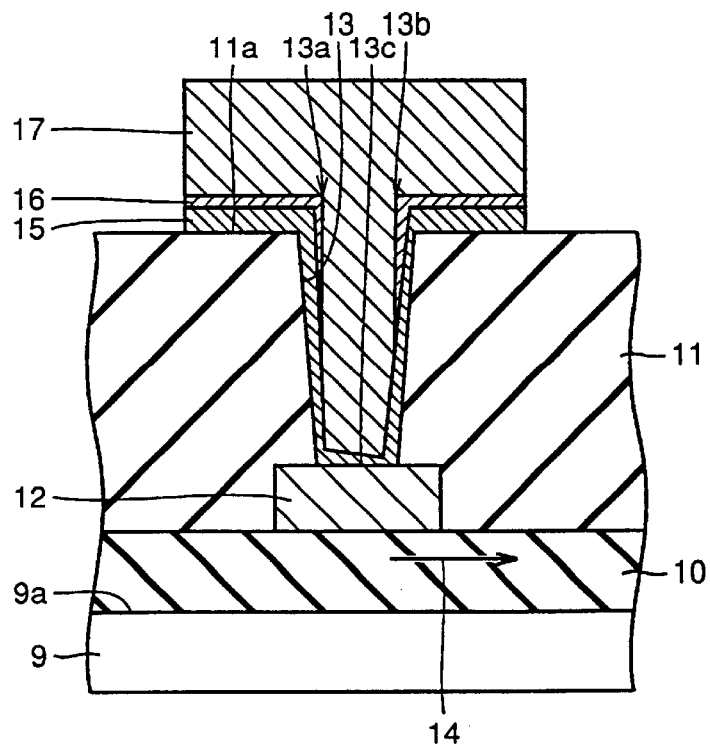

With reference to FIG. 5, silicon substrate 9 is removed from sputtering apparatus 1 and placed in a CVD (Chemical Vapor Deposition) apparatus. In the CVD apparatus, a tungsten layer 17 is formed on titanium nitride layer 16, and titanium nitride layers 15 and 16 as barrier layers are formed.

In accordance with this method, titanium nitride layer 15 is formed by sputtering while maintaining a sufficient distance between target 8 and silicon substrate 9 in the step shown in FIG. 3. By this procedure, bottom surface 13c of through hole 13 is surely covered by titanium nitride layer 15.

At the step shown in FIG. 4, sputtering is performed while maintaining a sufficiently close distance between silicon substrate 9 and target 3. Therefore the thickness of titanium nitride layer 16 thus formed by sputtering is uniform at upper portions 13a and 13b of through hole 13. As a result, in this manufacturing method, a barrier layer can surely be formed at the bottom portion of the through hole and moreover, the thickness of the barrier layer at the upper portions of the through hole can be made uniform.

When a sputtering process is performed at the step shown in FIG. 3, while keeping the distance between silicon substrate 9 and target 8 at 170 mm, the pressure in container 2 at 1.0 mTorr, and the ratio of the depth D to the width W (D/W) of through hole 13 at 3.0, the thickness of titanium nitride layer 15 at the bottom surface 13c of through hole 13 is 18% of the thickness of titanium nitride layer 15 on a main surface 11a of interlayer insulation film 11.

On the other hand, when the sputtering process is performed at the step shown in FIG. 3, while maintaining D/W at 3.0, the distance between silicon substrate 9 and target 8 at 54 mm, and the pressure in the container at 5.0 mTorr, the thickness of titanium nitride layer 15 at bottom surface 13c of through hole 13 is 3% of the thickness of titanium nitride layer 15 on main surface 11a of interlayer insulation film 11. This shows that the longer the distance between silicon substrate 9 and target 8, the thicker the titanium nitride layer 15 at bottom surface 13c of through hole 13.

Second Example

In the second example, steps other than the step shown in FIG. 4 in accordance with the first example are the same with the first example. In addition, in the second example, at the step shown in FIG. 4 in accordance with the first example, the distance between silicon substrate 9 and target 8 is 170 mm, argon of a flow rate of 25–30 ml/m and nitrogen gas of a flow rate of 100–120 ml/m are introduced into container 2, and the pressure in container 2 is 4.0 mTorr. In other respects, a semiconductor device shown in FIG. 5 is completed through the same steps with the first example.

According to the above described steps, the pressure at the formation of titanium nitride layer 16 is higher than the pressure at the formation of titanium nitride layer 15. Therefore the possibility of collision of titanium atoms scattered from target 8 with argon atoms or nitrogen molecules is higher in the former case. Hence, titanium atoms move in random directions even upon reaching interlayer insulation film 11, whereby the thickness of titanium nitride layer 16 is uniform at both upper portions 13a and 13b of through hole 13.

Third Example

In the third example, the pressure in container 2 is 1.0 mTorr at the step shown in FIG. 3 in accordance with the second example. Other steps are the same with the second example. The thickness of titanium nitride layer 15 at bottom surface 13c of through hole 13 is 18% of the thickness of titanium nitride layer 15 on main surface 11a of interlayer insulation film 11.

Comparative Example

In a comparative example, the pressure in container 2 is 5 mTorr at the step shown in FIG. 3 in accordance with the second example. Other steps are the same with the second example. The thickness of titanium nitride layer 15 at bottom surface 13c of through hole 13 is 9% of the thickness of titanium nitride layer 15 on main surface 11a of interlayer insulation film 11.

Fourth Example

Figure 6:
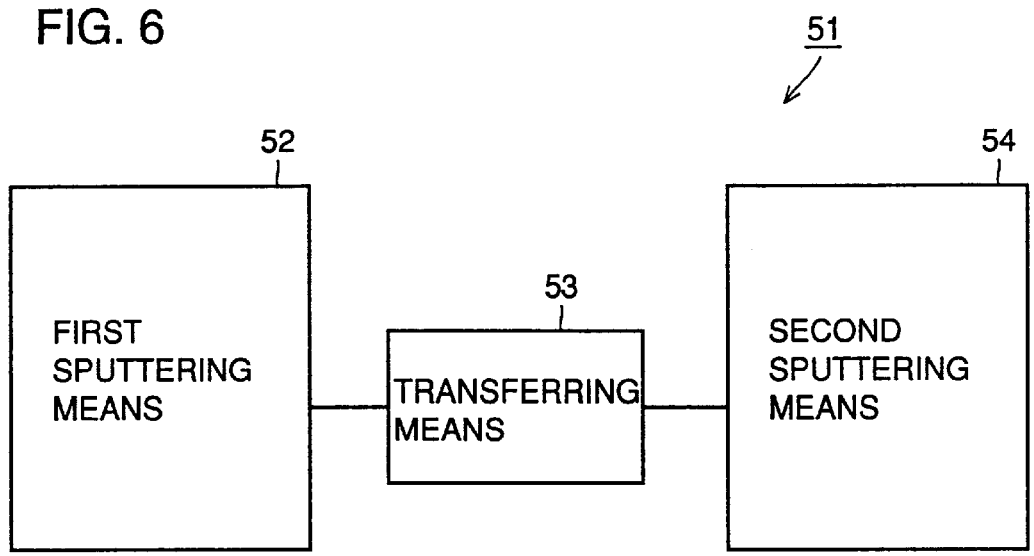
FIG. 6 is a block diagram of an apparatus for manufacturing a semiconductor device according to a fourth example of the present invention.
Figure 7:
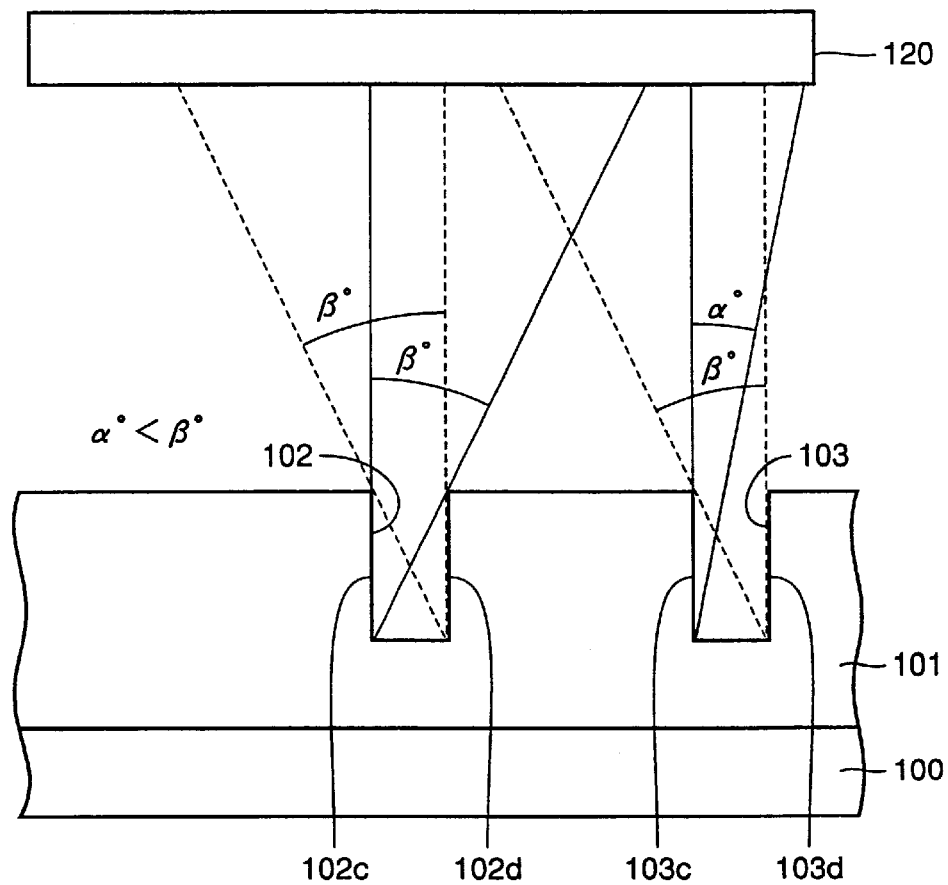
FIG. 7 is a schematic diagram of a sputtering apparatus referenced for describing a problem in a conventional sputtering.
Figure 8:
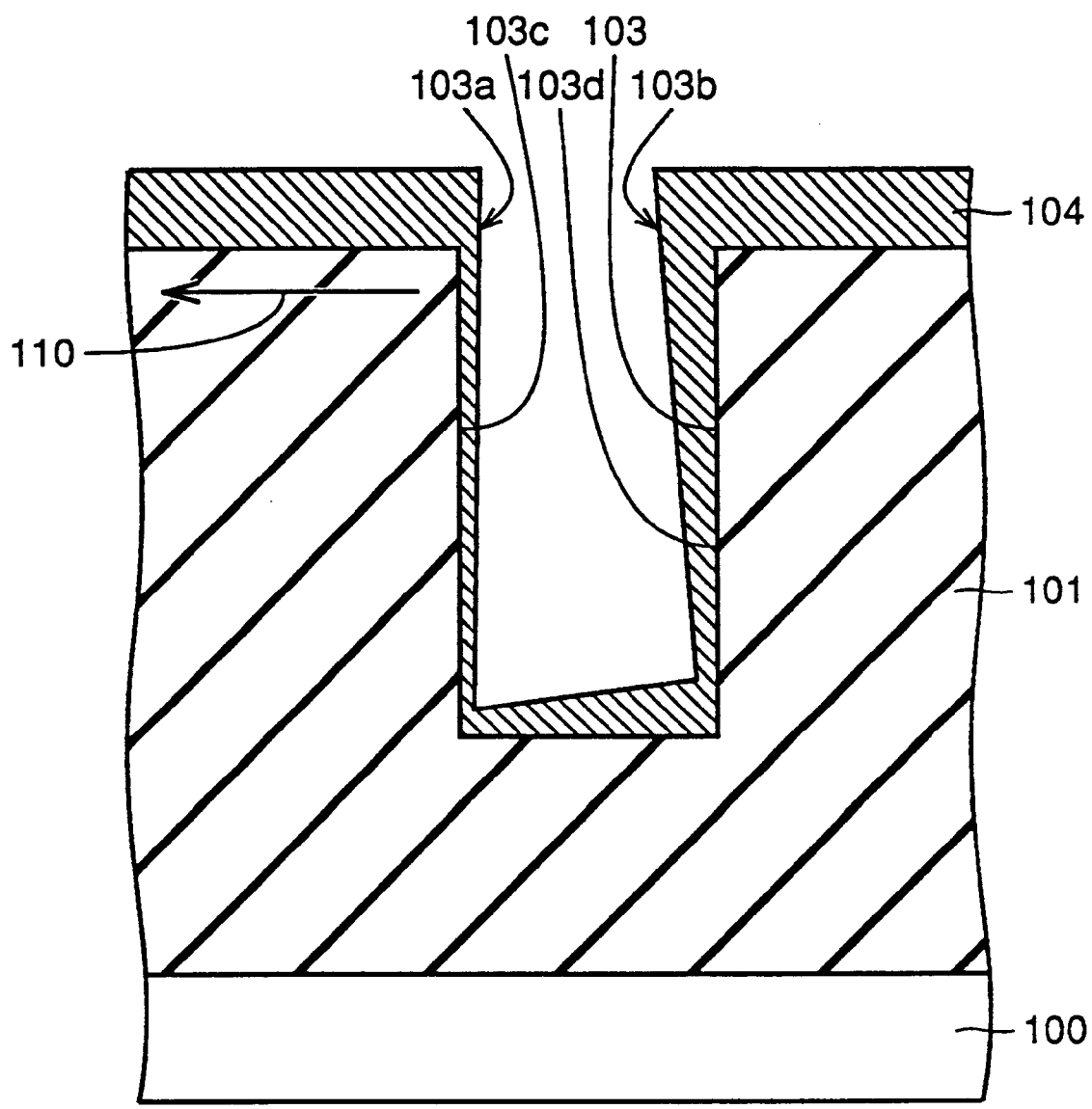
FIG. 8 is a sectional view of a barrier layer manufactured by a conventional manufacturing apparatus.

Referring to FIG. 6, a sputtering apparatus 51 in accordance with the fourth example of the present invention includes first sputtering means 52, transferring means 53 and second sputtering means 54. First and second sputtering means 52 and 54 both include sputtering apparatus 1 as the one shown in FIG. 1. The distance between silicon substrate 9 and target 8 in second sputtering means 54 is shorter than the distance between silicon substrate 9 and target 8 in first sputtering means 52.

In such sputtering apparatus 51, the distance between silicon substrate 9 and target 8 in first sputtering means 52 is set at 170 mm, for example. The pressure and the flow rate of argon and nitrogen gas are set the same with the first example. Then titanium nitride layer 15 is formed according to the step shown in FIG. 3. Next, silicon substrate 9 with titanium nitride layer 15 thereon is transferred from first sputtering means 52 to second sputtering means 54 by transferring means 53. Then, the distance between silicon substrate 9 and target 8 in second sputtering means 54 is set at 60 mm, for example. By setting the pressure and the flow rate of nitrogen and argon the same with the first example, titanium nitride layer 16 is formed on titanium nitride layer 15 in accordance with the step shown in FIG. 4. Then, tungsten plug layer 17 is formed in the same manner with the first example.

With the use of a sputtering apparatus such as sputtering apparatus 51, the production efficiency of the semiconductor device can be enhanced because silicon substrate 9 with titanium nitride layer 15 formed thereon can be swiftly transferred to second sputtering means 54 by transferring means 53.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising forming a composite barrier layer lining an opening in an insulation film on a main surface of the semiconductor substrate by disposing the main surface of a semiconductor substrate and a main surface of a target, that is a material of a film to be deposited as the layer;

forming a first film of said material by sputtering on a main surface of said semiconductor substrate while maintaining a first distance between the main surface of said target and the main surface of said semiconductor substrate;

forming a second film of said material by sputtering on and adjacent to said first film while maintaining a second distance shorter than said first distance between the main surface of said target and the main surface of said semiconductor substrate, leaving the opening unfilled; and filling the opening.

2. The method of manufacturing the semiconductor device according to claim 1, wherein said first distance is at least 170 mm and said second distance is at most 80 mm.

3. The method of manufacturing the semiconductor device according to claim 1, wherein said semiconductor device has an interlayer insulation film having a hole and said first and second films are formed so as to cover bottom and side surfaces of said hole.

4. A method of manufacturing a semiconductor device by disposing a main surface of a semiconductor substrate and a main surface of a target, that is a material of a film to be formed on the main surface of said semiconductor substrate, approximately parallel and opposite to each other, the method, comprising the steps of:

forming a first barrier film of said material by sputtering lining an opening while maintaining an atmosphere between the main surface of said target and the main surface of said semiconductor substrate at first pressure;

forming a second barrier film of said material by sputtering on and adjacent to said first barrier film while maintaining an atmosphere between the main surface of said target and the main surface of said semiconductor substrate at a second pressure higher than said first pressure leaving the opening unfilled; and filling the opening.

5. The method of manufacturing the semiconductor device according to claim 4, wherein said first pressure is at most 0.5 mTorr and said second pressure is at least 2 mTorr.

6. The method of manufacturing the semiconductor device according to claim 4, wherein said semiconductor device has an interlayer insulation film having a hole, and said first film and second film are formed so as to cover bottom and side surfaces of said hole.

* * * * *